United States Patent [19]

Kimura et al.

[11] Patent Number: 5,115,456
[45] Date of Patent: May 19, 1992

[54] MASK FOR EXPOSING WAFER WITH RADIATION AND ITS EXPOSING METHOD

[75] Inventors: Takeshi Kimura, Higashimurayama; Shinji Kuniyoshi, Tokyo; Akihiko Kishimoto, Tachikawa; Takashi Soga, Hachioji, all of Japan

[73] Assignee: Hitachi, Ltd., Tokyo, Japan

[21] Appl. No.: 447,865

[22] Filed: Dec. 8, 1989

[30] Foreign Application Priority Data

Dec. 23, 1988 [JP] Japan ................... 63-323293

[51] Int. Cl.⁵ .................................. G21K 5/00
[52] U.S. Cl. ............................. 378/35; 378/34
[58] Field of Search ............. 378/35, 34; 250/492.2, 250/492.21; 437/DIG. 106; 430/311, 317, 319

[56] References Cited

U.S. PATENT DOCUMENTS

| | | | |
|---|---|---|---|
| 3,742,230 | 6/1973 | Spears et al. | 378/35 |
| 3,873,824 | 3/1975 | Bean et al. | 378/34 |
| 3,974,382 | 8/1976 | Bernacki | 378/34 |
| 4,260,670 | 4/1981 | Burns | 378/34 |
| 4,301,237 | 11/1981 | Burns | 378/35 |
| 4,881,257 | 11/1989 | Nakagawa | 378/34 |

FOREIGN PATENT DOCUMENTS

| | | |
|---|---|---|
| 0069265 | 1/1987 | European Pat. Off. |
| 0266275 | 5/1988 | European Pat. Off. |
| 0364929 | 4/1991 | European Pat. Off. |
| 6318351 | 1/1988 | Japan |
| 6318352 | 1/1988 | Japan |
| 6318353 | 1/1988 | Japan |

*Primary Examiner*—Janice A. Howell
*Assistant Examiner*—Don Wong
*Attorney, Agent, or Firm*—Antonelli, Terry, Stout & Kraus

[57] ABSTRACT

A mask for exposing a wafer with radiation and its exposition method in which the radiation exposure mask is provided with at least two radiation exposure windows which each include a mask pattern of a smaller pattern area obtained by dividing a pattern area constituting an integrating circuit chip into a plurality of the areas, and a semiconductor wafer is exposed with radiation while the radiation exposure mask is intermittently moved by a distance of the size of the small pattern area.

8 Claims, 7 Drawing Sheets

F I G. IA
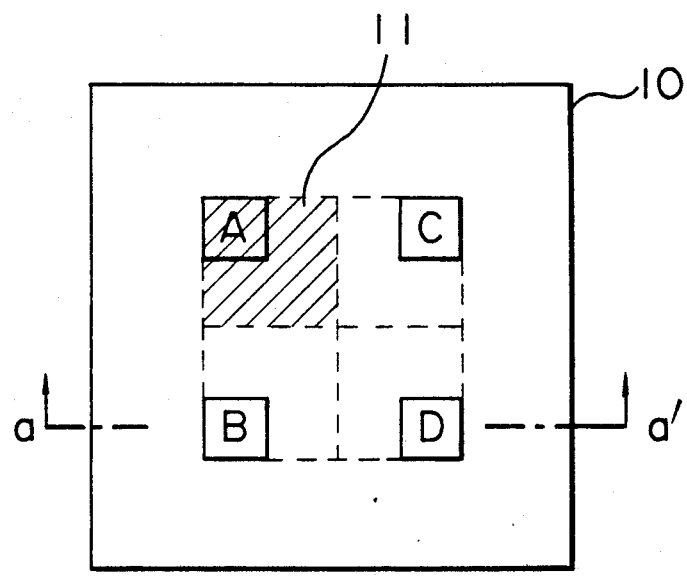
F I G. IB
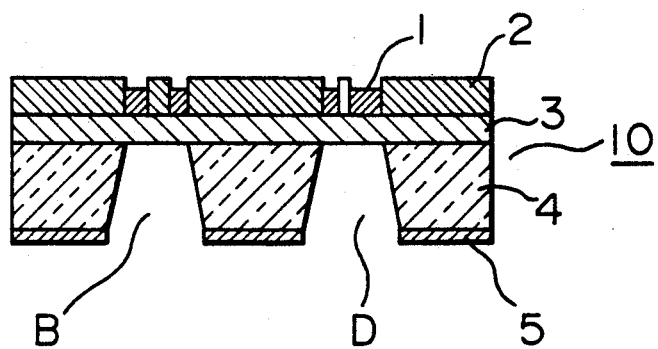

F I G. 2
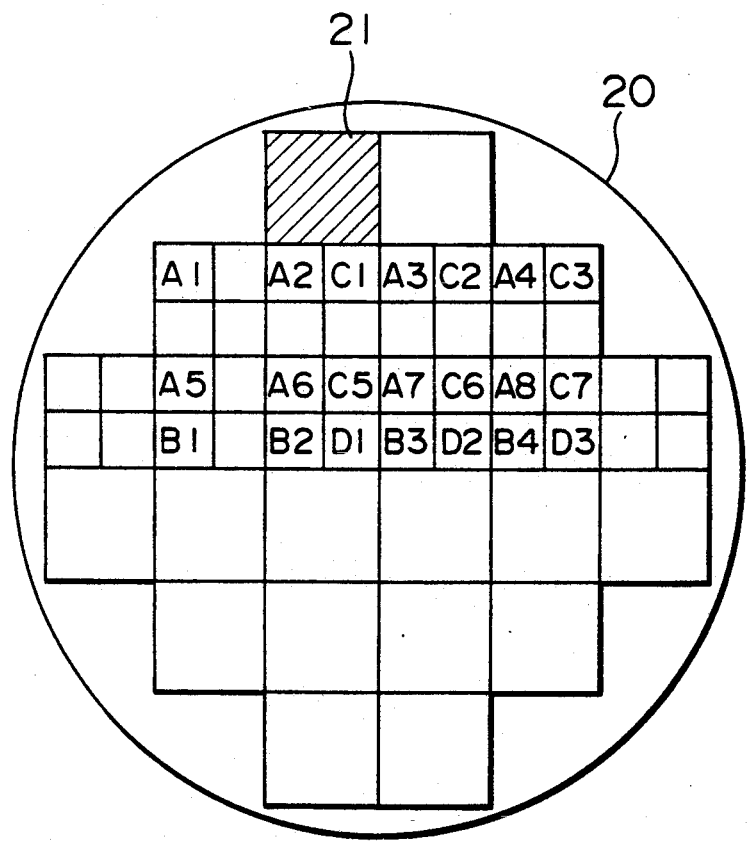

EXPOSURE WINDOW A   EXPOSURE WINDOW B

MASK FOR EXPOSING WAFER WITH RADIATION AND ITS EXPOSING METHOD

The present invention relates to fine pattern replicating lithography technology for the production of semiconductor integrated circuits, and more specifically, to a mask for exposing wafers which enables replicating smaller distortion patterns with the use of a soft X-ray as the exposure light source, and to an exposing method using the mask.

X-ray lithography is very promising as production technology of ultra-large scale integrated circuits represented by 64 and 256 megabit dynamic random access memories (DRAM), since X-ray lithography has resolving power of a sub-half micron or less. Nevertheless, this lithography system can produce X-ray masks having an accuracy of about $\pm 0.2$ $\mu$m ($3\sigma$) at present, since as shown in FIG. 4, the method uses projection of an X-ray 45 as the same scale through an X-ray exposure window 46 and then an X-ray mask composed of an X-ray absorber pattern 40, a membrane 41 and a support frame 42 on a resist film 44 above an Si wafer 43, and thus a problem arises in the pattern positioning accuracy of the X-ray mask, as discussed in SPIE Vol. 632, p. 118-132, (1986). On the other hand, production of semiconductor integrated circuits having a pattern size of 0.1-0.3 $\mu$m effective for the high resolving power of X-ray lithography requires a mask accuracy of $\pm 0.03$-0.07 $\mu$m. As a new trial to solve this problem, studies on a reduction type X-ray exposure system are under way by which mask patterns are reduced and replicated by using a lens and mirror. In this case, the X-ray mask accuracy can be relieved by an amount corresponding to the reduction rate. Even in this case, however, since the exposure field of X-ray mask must be increased in accordance with the reduction rate and the rate of pattern positioning accuracy to the exposure field does not change, the difficulty in producing X-ray masks has not been reduced remarkably.

As described above, consideration has been taken conventionally only to the aspect of materials and processes such as improvements in mechanical characteristics of thin film materials constituting X-ray masks and the reduction of residual stress which mainly causes the distortion, as to methods of improving the pattern positioning accuracy for the X-ray mask production.

It is an object of the present invention to provide a mask for exposing a wafer with radiation capable of improving the mask pattern positioning accuracy from the aspect of mask configuration.

It is another object of the present invention to provide an exposing method using the mask.

To achieve the above object according to the present invention, a radiation exposure mask is provided with at least two radiation exposure windows having mask patterns of a small pattern area obtained by dividing the pattern area constituting an integrated circuit chip into a plurality of the areas.

Further, a radiation exposure is carried out while the radiation exposure mask is intermittently moved a distance of the size of the small pattern area along the semiconductor wafer.

Since the radiation exposing mask according to the present invention is provided with an exposure window having a small size aperture, the distortion of the membrane is reduced and the mask pattern positioning accuracy can be improved greatly. In addition, the effect of residual stress of the mask pattern material is difficult to be exerted, and the mask can be manufactured more readily.

FIGS. 1A and 1B and FIGS. 3A and 3B are schematic diagrams of an X-ray mask embodying the present invention;

FIG. 2 is a schematic diagram showing an exposing method embodying the present invention;

Figure 5:
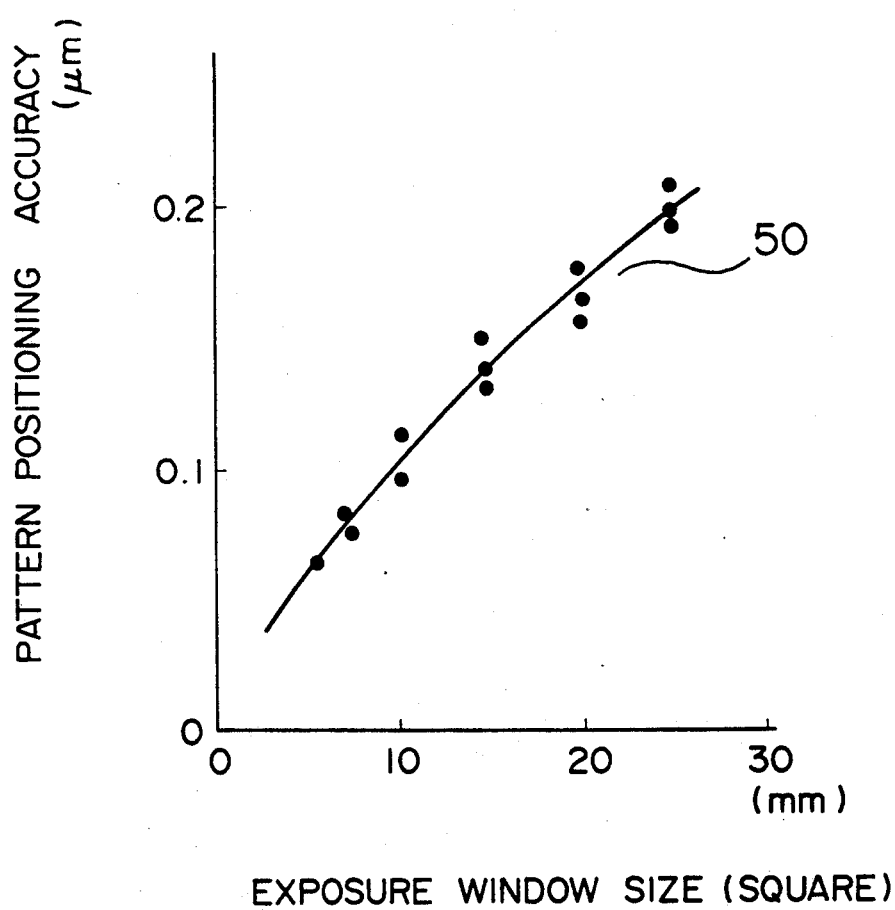
FIG. 5 is a characteristic diagram showing the relationship between an aperture of an exposure window and a pattern positioning accuracy of an X-ray mask.

First, the principle of the present invention will be explained. The distortion of an X-ray mask is mainly caused by the expansion and contraction of the membrane of the X-ray transparent film holding the X-ray mask which is effected by residual stress of the X-ray absorbing thin film constituting the X-ray mask pattern. When the mechanical stiffness and residual stress of the membrane and the X-ray absorbing material are constant, the distortion rate of the membrane is increased substantially in proportion to the aperture of X-ray exposure window, as shown by curve 50 in FIG. 5. Consequently, the aperture of X-ray exposure window is required to be made as small as to 10 mm square or less to make the positional accuracy of the X-ray exposure window to be $\pm 0.1$ $\mu$m or less. Incidentally, the size of chips for semiconductors typified by DRAM tends to increase year by year, and a 256 megabit DRAM is expected to have the size of at least about 25 mm $\times$ 15 mm. Therefore, it is very difficult to realize an X-ray mask having pinpoint accuracy by which ultra-large scale integrated circuits can be produced in the future.

By the way, LSI are produced in such a manner that LSI chips of the same pattern are repeatedly arranged at the same pitch on an Si wafer having a large diameter.

The present invention is achieved by taking the above-mentioned conditions into consideration. More specifically, as shown in FIGS. 1A and 1B, the present invention is characterized in that a plurality of exposure windows A, B, C, and D each having a small aperture are provided with patterns corresponding to the respective small pattern obtained by dividing the pattern area of the unit LSI 11 into a plurality of equal areas, and are arranged in one X-ray mask 10 at intervals restricted by an alignment rule of LSI patterns on an Si wafer. In this case, as expected from FIG. 5, the respective small aperture exposure windows A to D can sufficiently improve the pattern positioning accuracy therein.

FIG. 2 schematically shows a method of producing an LSI chip 21 on an Si wafer 20 using this X-ray mask, wherein A, B, C, and D designate types of the small aperture exposure on a single mask, and numerals A1, A2 . . . etc. show a sequence for exposing an X-ray, respectively. More specifically, after patterns have been replicated through the exposure windows A1, B1, C1, and D1 in a first X-ray exposure, the Si wafer 20 is moved stepwise and then the patterns of the exposure windows A2, B2, C2, and D2 are replicated. Thereafter, the stepwise movement and exposure are repeated sequentially, and in the example shown in FIG. 2, the pattern replication of the LSI chip 21 is completed by the aggregation of the small pattern areas of the exposure windows A6, B2, C5, and D1.

As described above, since the respective exposure windows A to D can be made small in accordance with the divided number of the LSI chip 21 in the X-ray mask according to the present invention, the above-mentioned pattern positioning accuracy of the mask can be greatly improved.

In addition, since the relative position between the respective small aperture exposure windows is maintained at a high accuracy by a mechanically rigid support frame, a large area can be exposed with a higher accuracy than that of conventional methods.

The present invention will be described in detail hereunder with reference to Examples.

EXAMPLE 1

FIGS. 1A and 1B show the arrangement of exposure windows of an X-ray mask 10 according to the present invention, wherein FIG. 1A is a plan view and FIG. 1B is a cross sectional view along the line a a -a' of FIG. 1A. An X-ray absorbing pattern 1 was prepared by making mask patterns of Au having thickness of 1.0 $\mu$m by an electroplating method using as a mask a stencil 2 for electroplating comprising a tri-level resist layer formed by an electron beam writing method and a dry-etching process. The above stencil for electroplating was mainly composed of polyimide resins. A membrane film 3 having a thickness of about 4 $\mu$m was composed of a boron-nitride film prepared by a low pressure chemical vapor deposition (CVD). A support frame 4 was composed of Si wafer having a thickness of 2 mm, and exposure windows A, B, C, and D were formed by etching and removing the Si wafer on the back thereof by a KOH solution using an Au film 5 as a mask.

A chip 11 for a 16 megabit DRAM treated here had a size of about 17 mm×11 mm and thus the exposure windows A-D had a size of 8.5 mm×5.5 mm. The boron-nitride membrane 3 had Young' modulus of about $2 \times 10^{11}$ N/m$^2$, and the electroplated Au film had residual stress of $3 \times 10^7$ N/m$^2$. As a result of the measurement of the mask positioning accuracy of each exposure window in the above conditions, an accuracy was obtained in the range of $\pm 0.02$–$0.03$ $\mu$m ($3\sigma$), and the relative positional accuracy between the respective exposure windows was $\pm 0.05$ $\mu$m. The ratio of Au pattern 1 to the area of exposure window was about 72%.

An X-ray mask having an aperture of 17 mm×11 mm prepared by the same material conditions and the method had a pattern positioning accuracy of $\pm 0.16$–$0.21$ $\mu$m ($3\sigma$), and thus the mask accuracy can be improved to $\frac{1}{4}$ to 1/5 by the execution of the present invention.

EXAMPLE 2

Figure 3A:
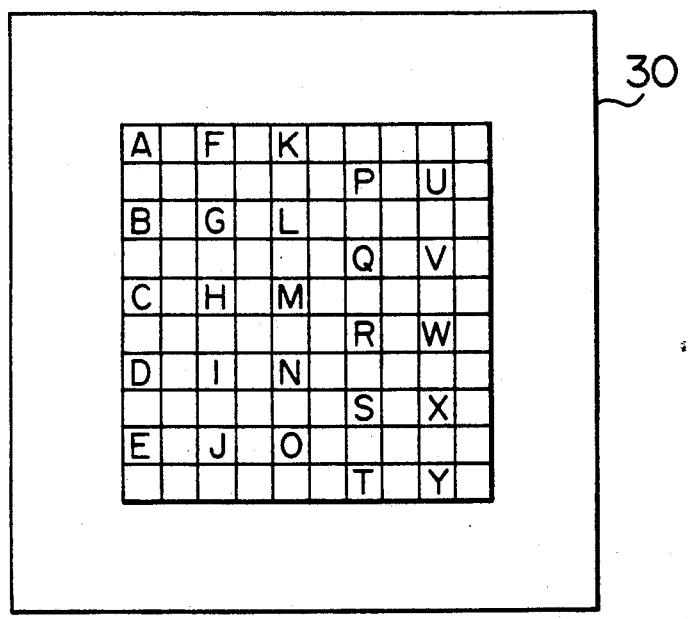
Figure 3B:
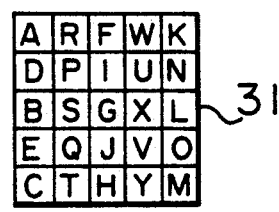
Figure 4:
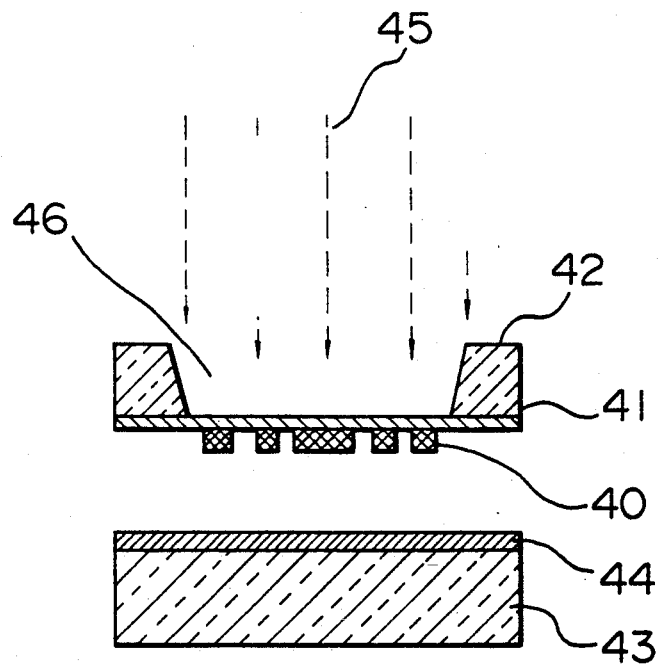
FIG. 4 is an explanatory diagram of the principle of X-ray lithography.

A prototype of an X-ray mask enlarged to 5 times was prepared for the same DRAM, supposing a reduction projection exposure method having a reduction rate of 1/5 be used. The characteristics of the respective material and arrangement of the X-ray mask were the same as those of Example 1. FIG. 3A is a diagram of an arrangement of exposure windows of the prototype of the X-ray mask 30. FIG. 3B shows a method of dividing the area of an LSI chip 31, wherein alphabetic characters show portions corresponding to the alphabetic characters showing the exposure windows of the mask in FIG. 3A. The mask 30 having exposure windows A - Y was suitably moved by a step and repeat mode to expose patterns composed of A - Y on the LSI chip 31. Since the area of the LSI chip 31 was divided to 25 portions, each of the exposure windows A - Y had a size of 17 mm×11 mm. A positioning accuracy of the mask pattern in each of the exposure window A - Y was $\pm 0.15$–$0.20$ $\mu$m ($3\sigma$), and thus it was substantially the same as that of the conventional method in Example 1, whereas a relative positioning accuracy between the respective exposure windows A - Y was $\pm 0.1$ $\mu$m and inferior to that of Example 1. It was found that this inferiority was caused by an increase in the lengthwise position detection error of $\pm 0.02$ $\mu$m ($3\sigma$) during the electron beam drawing and by an error of $\pm 0.08$ $\mu$m ($3\sigma$) due to the deformation of a support frame. It was found that since these errors were reduced to 1/5 by the reduction projection exposure method, the substantial positioning accuracy of the mask pattern on the pattern replicated surface of the Si wafer was improved as compared with an equal magnification projection exposure method of Example 1.

Figure 6:
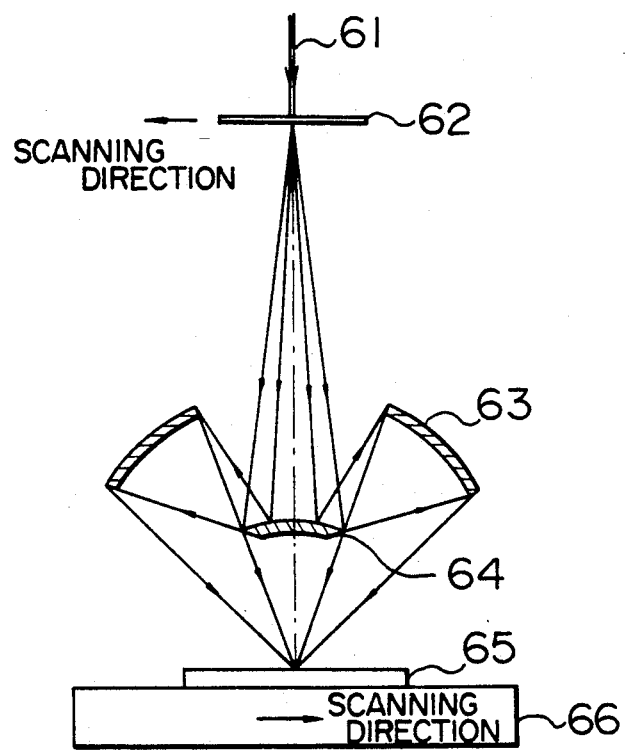
FIG. 6 is a diagram illustrating basic arrangement of an example of the reduction exposure method.

The above reduction projection exposure was carried out using the Schwarzschild reflective optics shown in FIG. 6, and a mask pattern was replicated to the radiation sensitive resist on a Si wafer while the mask and the Si wafer were being scanned at a speed ratio of 5:1. In this case, radiation 61 passing through a portion of a mask 62 was focused on an Si wafer 65 through reflection mirrors 63 and 64. The mask 62 and the Si wafer 65 were moved in a horizontal direction at a speed ratio corresponding to a reduction ratio by a wafer stage 87 or the like to replicate the pattern of the overall area of an LSI on the mask 62, wherein a portion of the pattern on the mask 62 was focused onto the Si wafer 65.

EXAMPLE 3

Figure 7:
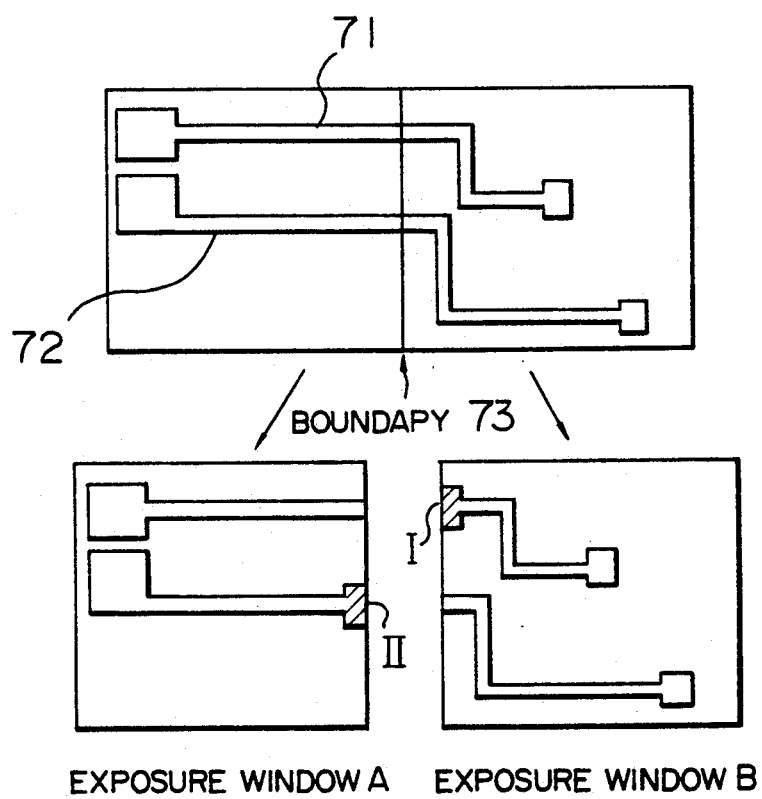
FIG. 7 is a model diagram showing the subsidiary pattern for alignment at the boundary of the exposure window.

A 256 megabit dynamic random access memory (DRAM) having the minimum line width of 0.1 $\mu$m was prepared using the mask described in Example 1. In this case, no problem arose when a discontinuous hole pattern such as, for example, a via-hole coupling the first layer wiring with the second layer wiring, was replicated. When, however, a continuous pattern such as a wiring pattern extending over the above exposure windows was replicated, radiation was exposed twice to the replicating pattern at the boundary of an exposure field, and thus the size of the replicated pattern was changed or the ring pattern between the exposure windows was dislocated about 0.06 $\mu$m due to the error determined by the mask pattern positioning accuracy ($\pm 0.02$–$0.03$ $\mu$m) described in Example 1 or by a mask alignment accuracy. Then, as shown in FIG. 7, subsidiary patterns I and II for alignment were provided with a pattern boundary 73 in the exposure window of at least one of the wiring patterns 71 and 72 extending over exposure windows A and B. As a result, the wiring patterns 71 and 72 at the boundary 73 were prevented from being disconnected by mis-alignment, whereby LSI could be produced with high yield.

EXAMPLE 4

Figure 8:
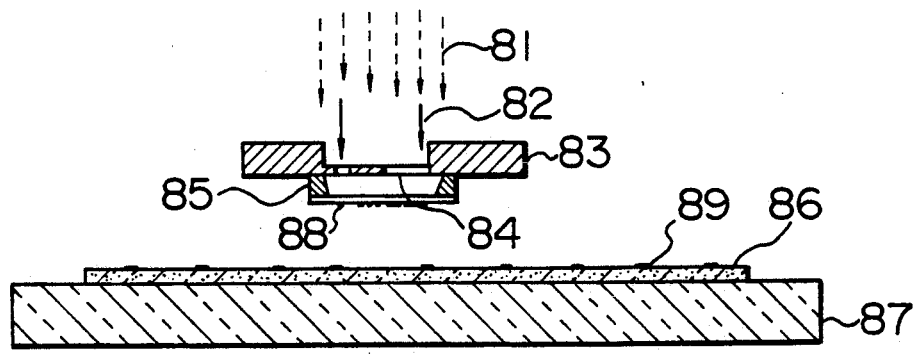
FIG. 8 is a schematic diagram of the arrangement of the exposure apparatus.

FIG. 8 is a schematic diagram of an exposure apparatus used when patterns are replicated using the mask according to the present invention.

A mask stage 83 was provided with an aperture 84 so that radiation was irradiated only to the exposure window of a mask 85. The patterns were replicated by the following method.

First, a mark 88 on a mask 85 and an alignment mark 89 on a wafer 86 were detected using a light beam 82 for alignment mark detection, and the mask 85 was aligned with the wafer 86 by slightly moving the wafer stage 87. Thereafter, exposed radiation 81 is used to replicate mask patterns onto the Si wafer 86. Then, in the present invention, the wafer stage 87 was moved stepwise by the size of the exposure windows divided into a plural number or an integral multiple of the divided size, and then alignment and exposure were repeated step by step to replicate LSI patterns over the entire surface of the Si wafer 86, although the wafer stage 87 was conventionally moved stepwise by the chip size of an LSI to be formed or by an integral multiple of the size in the X or Y direction on the surface of the Si wafer 86. Therefore, the conditions required for the exposure apparatus specific to the execution of the present invention was to move the Si wafer stage 87 stepwise by a fraction of an integer of the LSI chip size.

Although the stepwise moving function is provided with the wafer stage 87 in the exposure apparatus of this embodiment, it will be readily conceived that the wafer stage 87 may be moved by an integral multiple of the LSI chip size similarly to a conventional one, and the mask stage 83 may be provided with a function by which it is moved by a fraction of an integer of the LSI chip size.

Although specific examples of the present invention are described with reference to Examples 1 to 4, the membrane film may be composed of a Si-N type, diamond, SiC or Be and the X-ray absorbing pattern may be composed of W, Pt, Ta, Rh, Si, Ag, Mo, Al and an alloy thereof in addition to the above, as materials of the radiation mask. Further, although the Schwarzschild type was used as a example of the reduction projection optics, Wolter type reflective optics or transparency reduction optics using a zone-plate may be used in addition to it. Further, although soft x-ray was used as the exposure light source, an electron beam, an ion-beam or usual light may be effectively used for the present invention.

Further, although the exposure windows of the mask are provided with different pattern regions having a size of a fraction of an integer of the LSI chip size in the above examples, the provision of at least two exposure windows having the same pattern area will have an effect equal to or greater than that of the above examples. In addition, it will be readily realized that a plurality of these exposure windows need not have the same size and that, for example, the exposure window A of FIG. 1 may be further divided, for example, to four portions and distributed. In this case, it will be of course considerable that the fine regions of the LSI pattern are divided into more exposure windows to increase the positioning accuracy thereof.

According to the present invention, the distortion of the membrane composed of a thin film is reduced and a pattern positioning accuracy of the X-ray mask can be improved by almost one figure as compared with that of a conventional method. In addition, since the effect of the residual stress of the mask pattern, which is the main cause of the distortion of the mask, becomes difficult to be exerted, the X-ray mask can be produced more readily than in a conventional method.

What is claimed is:

1. A mask for exposing a wafer with radiation comprising:

a thin film through which the radiation can pass;
   a mask pattern disposed at a first side of said thin film for absorbing the radiation, said mask pattern having a plurality of rectangular mask pattern areas arranged at prescribed intervals, and each of said rectangular mask pattern areas corresponding to a respective predetermined divided area of a single integrated circuit chip of the wafer; and
   a support frame positioned at a second side of said thin film for supporting said thin film, said support frame having a plurality of radiation exposure windows respectively aligned with said plurality of rectangular mask pattern areas of said mask pattern.

2. A mask for exposing a wafer with radiation according to claim 1, wherein the radiation exposure windows of said support frame are spaced apart from one another by a distance corresponding to an integral multiple of a width of one of said rectangular mask pattern areas.

3. A mask for exposing a wafer with radiation according to claim 1 or 2, wherein said radiation is X-ray radiation.

4. A mask for exposing a wafer with radiation according to claim 1 or 2, wherein a first one of said rectangular mask pattern areas and a second one of said rectangular mask pattern areas each comprise at least one line pattern, and each line of the line patterns which crosses a boundary between said first rectangular mask pattern area and said second rectangular mask pattern area is enlarged at the boundary, at least in width, with respect to all other non-boundary portions of the crossing line.

5. A radiation exposure method comprising the steps of:

disposing a radiation exposing mask over a wafer covered with a resist, said radiation exposing mask, including a mask pattern capable of absorbing radiation, said mask pattern having a plurality of rectangular mask pattern areas arranged at prescribed intervals, and each of said rectangular mask pattern areas corresponding to a respective predetermined divided area of a single integrated circuit chip of the wafer; and
   alternately irradiating said resist by passing the radiation through said mask and moving one of said mask and said wafer relative to the other of said mask and said wafer.

6. A radiation exposure method according to claim 5, wherein patterns are replicated on said wafer by reducing and projecting said mask pattern.

7. A radiation exposure method according to claim 5, wherein said radiation is X-ray radiation.

8. A radiation exposure method utilizing a radiation exposing mask disposed over a wafer, said radiation exposing mask including a mask pattern capable of absorbing radiation, said mask pattern having a plurality of mask pattern areas arranged at prescribed intervals, each of said rectangular mask pattern areas corresponding to a respective divided area of a single integrated circuit chip of the wafer, and said method comprising the steps of:

irradiating a portion of said integrated circuit chip corresponding to one of said rectangular mask pattern areas;
   adjusting a positional relationship between said mask and said integrated circuit chip of the wafer; and
   repeating the irradiating and adjusting steps until a complete circuit is formed on said integrated circuit chip of the wafer over each of the predetermined divided areas of said integrated circuit chip of the wafer.

* * * * *